United States Patent [19]

Luck et al.

[11] Patent Number: 5,402,303

[45] Date of Patent: Mar. 28, 1995

[54] REMOTELY-POWDERED AND REMOTELY-ADDRESSED ZERO-STANDBY-CURRENT ENERGY-ACCUMULATING HIGH-POWER SOLENOID DRIVERS, PARTICULARLY FOR SYSTEMS THAT ARE MICROPOWERED

[76] Inventors: Jonathan M. Luck, 6537 Reflection Dr., Apt. 210, San Diego, Calif. 92124; Wyn Y. Nielsen, 8650 Villa La Jolla Dr. #6, La Jolla, both of Calif. 92037

[21] Appl. No.: 688,631

[22] Filed: Apr. 18, 1991

[51] Int. Cl.⁶ .................... H02M 3/18; H01H 47/32
[52] U.S. Cl. ................... 361/172; 361/170; 361/171; 361/155; 307/110
[58] Field of Search ............... 307/38–42, 307/110; 363/61, 63; 361/152, 153, 155, 156, 160, 166, 167, 168.1, 169.1, 172, 205, 154

[56] References Cited

U.S. PATENT DOCUMENTS

| | | | |
|---|---|---|---|
| 4,241,375 | 12/1980 | Ruggles | 361/166 |
| 4,409,638 | 10/1983 | Sturman et al. | 361/152 |
| 4,527,216 | 7/1985 | Stammely | 361/156 |
| 4,645,882 | 2/1987 | Nakayama et al. | 361/156 X |
| 4,679,766 | 7/1987 | Cuming | 361/155 X |
| 4,716,490 | 12/1987 | Alexanian | 361/155 |
| 4,718,454 | 1/1988 | Appleby | 361/156 X |
| 4,737,696 | 4/1988 | Yokogawa et al. | 361/152 X |
| 4,777,556 | 10/1988 | Imran | 361/155 |
| 5,008,773 | 4/1991 | Yoshida et al. | 361/187 |
| 5,099,384 | 3/1992 | Chin | 361/166 |

Primary Examiner—A. D. Pellinen
Assistant Examiner—Fritz M. Fleming
Attorney, Agent, or Firm—William C. Fuess

[57] ABSTRACT

One or more loads, commonly solenoids, requiring a high-power drive—typically 500 ma. 7.5 v.d.c.—are selectively actuated by energy that is accumulated over time—typically over several hundred milliseconds—within associated, addressable, energy-accumulating high-power drivers. The energy accumulation is solely from micropowered signals—typically 1 ma., 4.5 v.d.c.—that are received from a control system that is itself micropowered—typically from a high-equivalent-series-resistance power source. The energy-accumulating high-power solenoid drivers (i) accumulate predetermined amounts of energy only as, when, and to such extent as is required, (ii) multiply the voltage (nominally times two) of the received micropowered signals, and (iii) shape the current waveform of the output high-power solenoid drive signals—all as desired so as to optimally both use and conserve energy. The selfsame micropowered signals normally supply several energy-accumulating solenoid drivers in electrical parallel, selectively addressing an individual one such driver. Each energy-accumulating solenoid driver is tri-stated, and neither consumes nor leaks energy save imminently upon the times of its selected actuation, and of the actuation of the load that it drives.

12 Claims, 10 Drawing Sheets

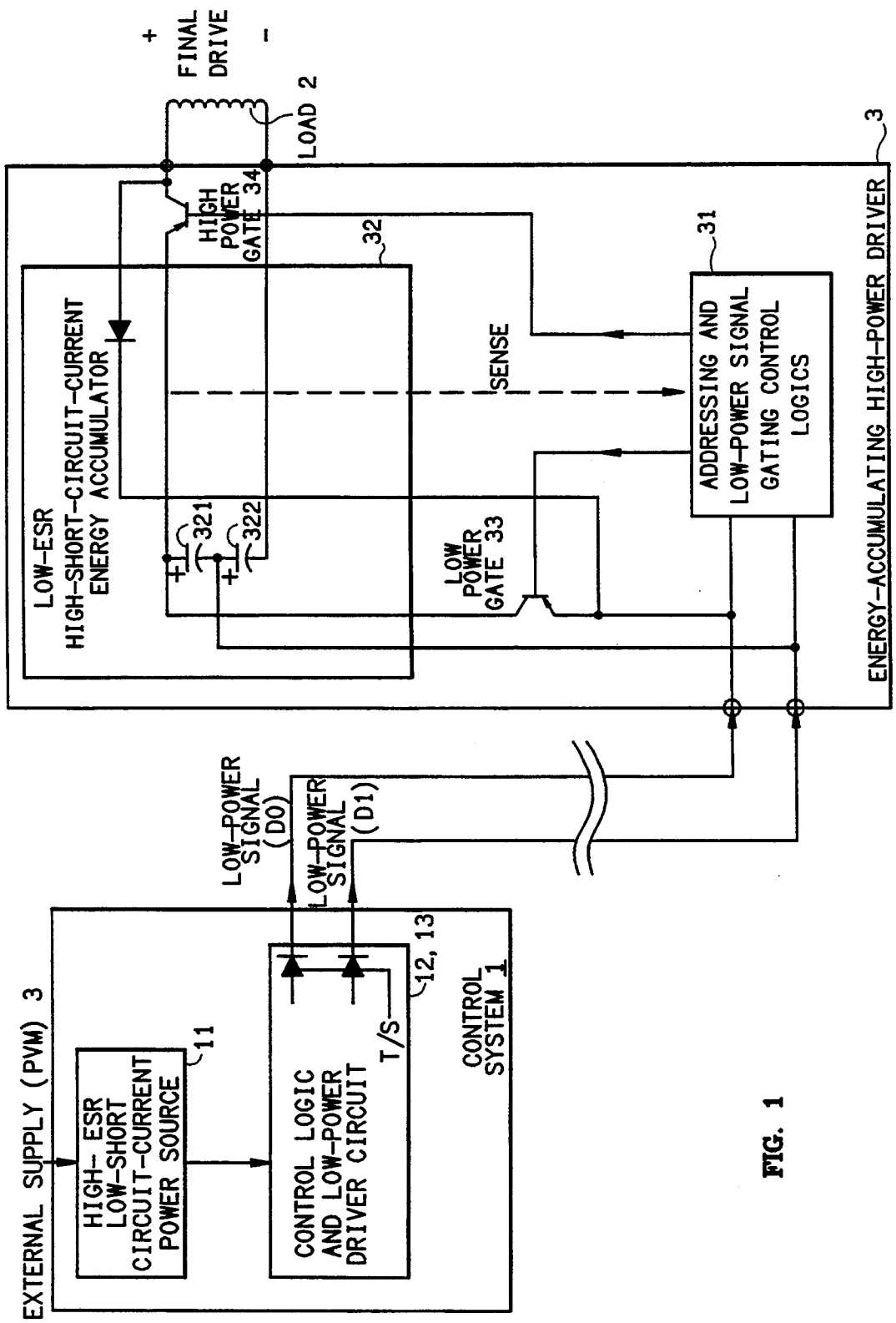

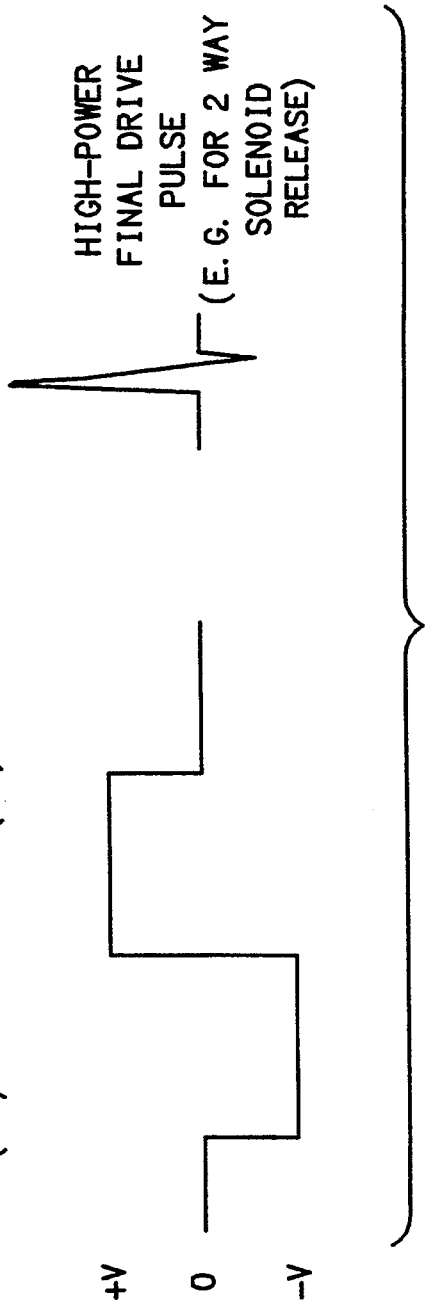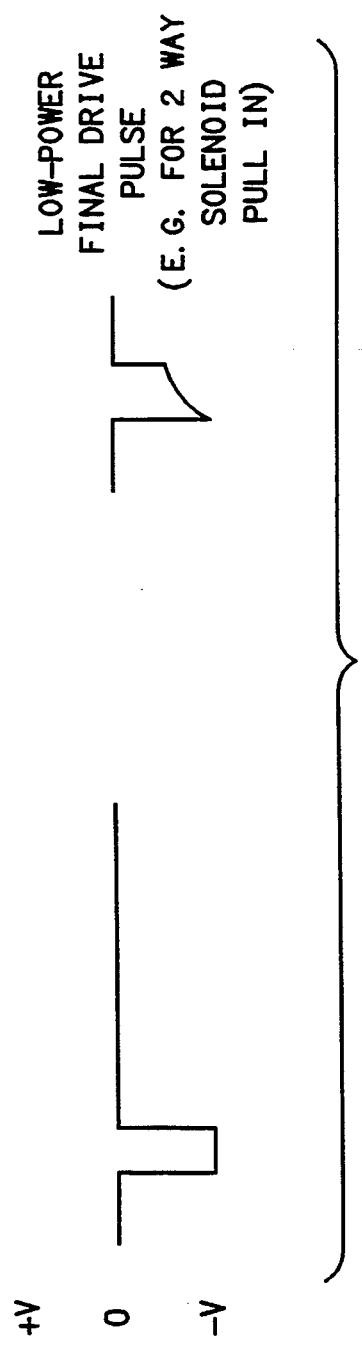

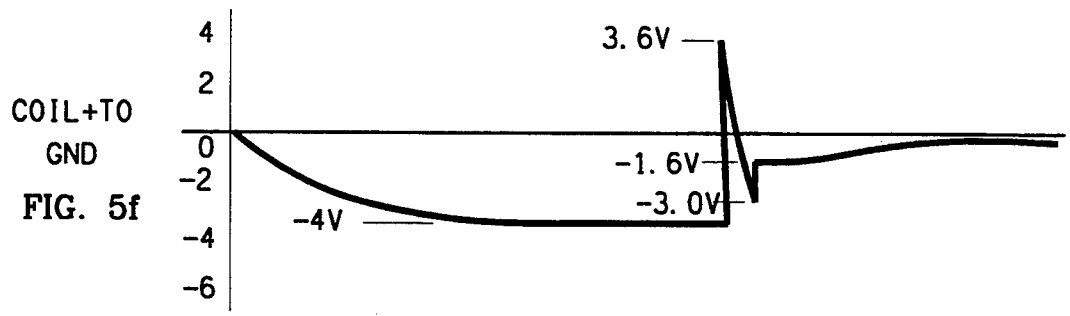
FIG. 5f COIL+ TO GND
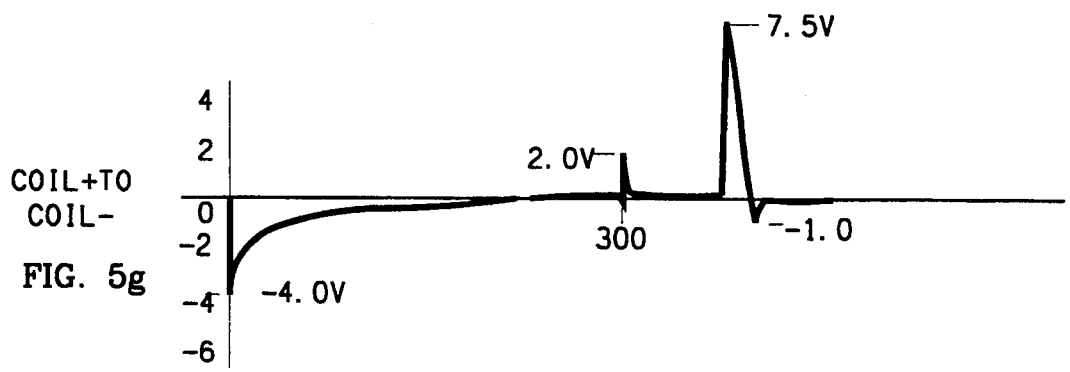
FIG. 5g COIL+ TO COIL−
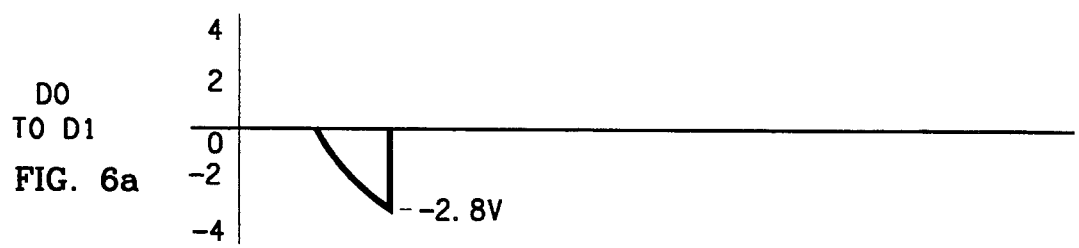
FIG. 6a D0 TO D1
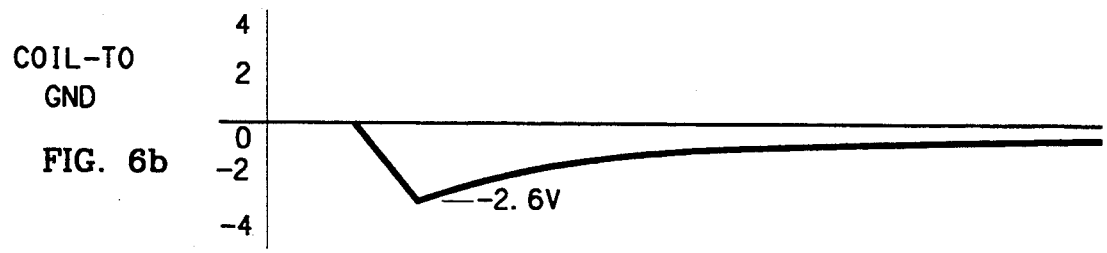
FIG. 6b COIL− TO GND
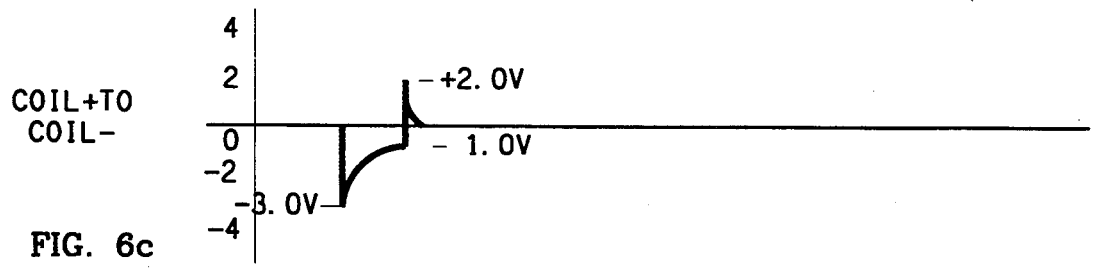
FIG. 6c COIL+ TO COIL−

REMOTELY-POWDERED AND REMOTELY-ADDRESSED ZERO-STANDBY-CURRENT ENERGY-ACCUMULATING HIGH-POWER SOLENOID DRIVERS, PARTICULARLY FOR SYSTEMS THAT ARE MICROPOWERED

BACKGROUND OF THE INVENTION

1. Field of the Invention

The present invention generally concerns systems for producing high-current high-power drive pulses, such as, for example, pulses used for driving solenoids such as are, for example, used in solenoid valves. The present invention particularly concerns the energy-conserving production of high-power drive pulses by the efficient accumulation, and use, of energy from low-power pulses such as may be produced, for example, in systems that are micropowered.

2. Background of the Invention

Small solenoids and like electromagnetic devices used in applications wherein the solenoids are only momentarily actuated, such as latching solenoids in solenoid valves, typically require electrical actuating pulses having an instantaneous, or peak power that is typically in the order of 250–10,000 milliwatts, for time durations that are typically on the order of tens to hundreds of milliseconds. Latching solenoids consume no power once driven to one of two stable states.

The energy requirement to momentarily actuate a small solenoid is, commensurate with the nominal magnitude and time duration of the electrical power applied, typically modest. The energy within the solenoid drive pulses ranges from 250 milliwatts for 0.02 seconds (5 millijoules) for the smallest, latching, solenoid devices to 10 watts for 3 seconds (30 joules), and higher, for industrial control applications.

2.1 Energy Can be Conserved in the Pulsed Actuation of a Solenoid

The electrical pulse for actuating a solenoid is preferably not of rectangular shape in either its voltage or its current waveform. Instead, a larger current is desirably applied to the solenoid's coil at the onset of the solenoid's actuation in order to compensate for the initially-large air gap in the magnetic circuit, and in order to overcome the inertia of the solenoid plunger and any driven elements connected thereto. A smaller current suffices for the remainder of the actuation cycle. One modern solenoid driver circuit that is concerned with shaping a solenoid drive waveform in order to conserve power, with claimed energy savings at levels up to 90%, is contained within the Fluxton TM coil assembly (trademark of Honeywell, Inc.) used with the Skinner electric valves of the Skinner Valve Division, New Britan, Conn. 06051. Skinner valves are a product of Honeywell, Inc., a worldwide manufacturer of Controls.

2.2 Even an Energy-Conserving Pulse-Actuated Solenoid Requires a High Peak Power of Actuation, Which Power is Typically Met by an Power Source That Leaks Energy, and is Attenuated in Transmission Whether a solenoid is actuated by a driver circuit that conserves energy or not, the actuation pulse is typically of such a power level so that it must arise from a power source having a low equivalent series resistance (low ESR), which is equivalent to saying that the power source must have a high peak, or short-circuit, current. An electrolytic capacitor admirably suits these requirements. Accordingly, it is the energy storage element typically used. The electrolytic capacitor stores electrical energy, in the form of electrical charge, which is used, as a high current pulse, in order to actuate the solenoid. The electrolytic capacitor is commonly charged by a battery. At some indeterminate time after the electrolytic capacitor becomes fully charged its stored energy is controllably gated through a power switch (normally a power transistor) in order to actuate the solenoid.

This standard approach to energizing a solenoid suffers from two problems. First, the electrolytic capacitors, or other equivalent energy storage devices having a low equivalent series resistance/high peak short-circuit current, commonly suffer from charge leakage. The attendant energy loss is dependent upon the duty cycle of operation, the environmental conditions, the quality of the electrolytic capacitor (or other component) and/or other factors. However, energy losses may typically range to 40+% over protracted time periods when the capacitor is normally fully charged, and is but seldom drained of its charge. Second, the transmission of short high-power pulses, as are typically required for solenoid actuation, suffers from ohmic losses (proportional to the square of the drive current times the line resistance), and attenuation. If the transmission lines are long, such as commonly occurs for actuation of remotely-situated solenoids in the electric valves of irrigation systems, and other systems, then such ohmic losses may unacceptably reduce the voltage present at the solenoid—preventing its proper and/or efficient operation. Whereas the previous solution has been to use larger, lower-loss, transmission lines, and/or higher voltages and power, the present invention will be seen to substantially obviate the entire problem.

2.3 Energy-Conserving Power Sources Exist, But are Unsuitable to Directly Drive Solenoids Interestingly, large amounts of electrical energy can be efficiently and effectively stored in devices, and particularly in multi-insulating-layer electrolytic capacitors having at least one carbon paste electrode that do not leak appreciable charge. Such capacitors are commonly called "supercapacitors", and are frequently of large capacitance. Alas, these supercapacitors have a high equivalent series resistance (high ESR) and a corresponding low peak, or short-circuit, output current.

These low-loss supercapacitors, or like devices, are commonly used in the power supplies for low and micropowered electronic control circuits. Modest as the power levels for actuation of a small solenoid are, or can be tailored to be, such power levels are still greatly in excess of the power that is commonly provided by supercapacitor-based power supplies to micropowered electronic control, or logic, circuitry. A typical drive signal in such circuitry is on the order of 3–5 v.d.c. and 100 microamperes (for a duration from 10 nanoseconds to 10 microseconds), and typically contains less than 500 microwatts of power (and 0.005 microjoules of energy). The power, or energy per unit time, that is provided by the supercapacitor-based low-loss power supply to its associated control circuitry, or to anything else, is thus typically more than two orders of magnitude less than the power required to drive a solenoid.

2.4 Even If a Circuit Which Permitted the Use of an Energy-Conserving Power Supply Having a Low Power Output In Order to Drive a High Power Solenoid Were to be Hypothesized, Such a Circuit Must Not Simply Move the Energy Loss That Was Previously Within a Low ESR Power Supply Into the Circuit It might be hypothesized that a solution to this power mismatch between a high ESR power supply (primarily for logic circuitry) and a driven solenoid could be realized by a power accumulator circuit. In such a power accumulator circuit the power, meaning energy per unit time, which the high ESR power supply is able to provide would accumulated over time, typically as electrical charge on a capacitor. After a period of time the accumulated charge would be gated, as a pulse of adequate voltage and current (i.e., power), in order to actuate the solenoid.

A problem exists with this hypothesized method, just as with previous power accumulator circuits, if and when not only the specific power, but also the overall total energy budget, of the high ESR power supply is limited. Such a limited energy budget, along with a low specific power output, might arise, for example if the high ESR power supply was itself powered by a battery, or by a solar array, energy source of minuscule energy production capacity. Such a scenario is not uncommon, nor improbable. A complete. irrigation control system operating on only the power in sunlight falling on a 4 inch by 6 inch photovoltaic module (PVM) is shown in companion patent application Ser. No. 255,150 filed Oct. 4, 1988, for a LIGHT-ENERGIZED ENERGY MANAGEMENT SYSTEM, the contents of which application are incorporated herein by reference.

The problem with the previous actual, and the hypothesized present, power accumulation methods, and power accumulator circuits, is that they tend to leak, over the prolonged periods during which they hold energy prior to gating such energy to actuate a solenoid, a significant proportion of the energy that they accumulate, and hold. A typical accumulator circuit employing a capacitor might be expected, over time, to leak 40% of the energy with which it is supplied, and to use only 60% of the total energy with which it is supplied for actuation of one or more solenoids.

2.5 It is Desirable to Stem Energy Losses Accompanying High-Power Solenoid Drive on a Broad Front, and in All Areas Simultaneously Although these various electrical energy loss mechanisms, and levels, attendant upon developing a high-power solenoid drive were scarcely considered in the past or, if considered, were regarded as effectively inevitable, there are modern reasons for attempting to comprehensively reduce energy losses in accumulating energy to drive solenoids, and in actually driving the solenoids. One reason is that lower losses permit weaker, and smaller, sources of power: fewer or smaller batteries, smaller solar arrays, etc. Another reason is that efficient, low-loss power accumulators recharge faster at the same rate of input power, and may thus be cycled more often.

2.6 In a Related Area, It Would be Useful if Certain Data Could be Gathered at a Low Energy Cost at the Sites of Solenoid Actuations Certain applications of solenoids, such as in electric valves, produce or control phenomena that are desirably monitored. A monitoring of phenomena, such as the rate and/or amounts of fluid flow, that result from solenoid actuations permits the realization of a feedback control loop. In such a feedback control loop the sensed phenomena are used to regulate the times, numbers, and/or durations of the solenoids' actuations.

This monitoring incurs both an energy cost, and a cost in communications overhead (e.g., channels, or wires). It would be useful if (i) the energy cost of monitoring could be minimized, simultaneously that (ii) the communications cost of monitoring phenomena resultant from solenoids' actuations could also be minimized.

2.7 The Wired Interconnection of Distributed Solenoids is Costly

Small solenoids used in control applications may be spatially distributed, such as over an area ranging to many acres and larger in typical irrigation applications of solenoid valves. Distribution of the actuating pulses to these distributed solenoids is typically from a centralized controller and solenoid driver by point to point wired connection. In order that the ohmic power losses in the wired connection—which losses are proportional to voltage times current ($V \times I$), or current squared times resistance ($I^2 \times R$)—the resistance of the wired connection should not be too high. Accordingly, eighteen gauge and lower gauge wires are typically used, at considerable cost.

Moreover, connection of spatially distributed solenoids is typically as the hub of a wheel and its spokes. This manner of connection is normally longer than a daisy chain connection.

Still further, the risk of harmful electrostatic potential—due to electrostatic pulse (ESP) or electromagnetic discharge (EMD)—that may be developed at a central point, or controller, varies with connection. When a controller is connected by multiple wires to multiple other circuit points as the hub of a wheel then a voltage difference may appear at the controller, equal to the maximum voltage difference between any of the multiple points to which it is connected. Conversely, when a controller is connected in parallel to multiple points by a single wire, or by a differential wire pair, along a daisy chain then a large differential voltage cannot appear across the controller. Such an ESP or ESD may develop, for example, because of lightning strikes to ground in an irrigation system. If a central irrigation controller is directly connected, as a hub, to widely separated several solenoid valves, as spokes of a wheel, then a large, and potentially destructive, voltage potential may appear across the irrigation controller. Large induced voltage differences may also arise from ground currents associated with high voltage power transmission lines.

SUMMARY OF THE INVENTION

The present invention contemplates (i) accumulating over time energy from a high ESR power source, and from low-power signals that are produced from such a high ESR power source, so as to, ultimately, produce a high-power pulse that is suitable, for example, to actuate a solenoid. As well as accumulating the energy of the low-powered signals, an energy-accumulating high-power solenoid driver in accordance with the invention also (ii) multiplies the voltage of the low-power signals with which it is supplied (nominally times two), and (iii) shapes both the output voltage and the output current waveform, in its production of an high-power output pulse that is optimal for the drive of a solenoid. Each of several energy-accumulating solenoid drivers may optionally be connected in electrical parallel to the self-same identical low-power signals, the low-power signals thereafter (iv) selectively addressing an individual one energy-accumulating solenoid driver from among a number of such drivers. Still further, (v) the energy-accumulating solenoid drivers are tri-stated to the low-power signals by which they are (optionally) selectively addressed, and from which they selectively accumulate power—making that the whole scheme of actuating solenoids from, and with, a micropowered control system neither consumes nor leaks energy (save imminently upon such times as the solenoids are actuated).

It should be understood that the high ESR power source has, and supplies, all the necessary energy for all the high-powered actuations of all the solenoids. It is simply the case that a high-equivalent-series-resistance, low-short-circuit-current, power source cannot supply sufficient instantaneous power so as to permit actuation of the solenoids directly, and in real time. However, signals of lesser power—called "control signals" because (i) they are analogous to digital logic communication signals and (ii) they are also used for addressing—may readily be generated from the high ESR power source. An accumulation in and by an energy-accumulating high-power solenoid driver of the modest energy in these control signals ultimately permits such a driver to actuate a solenoid, or other device such as a flash lamp requiring a high power drive pulse, with its accumulated and stored energy.

There are multiple aspects to, and advantages realized by, the present invention.

In one aspect of the invention, a high-equivalent-series-resistance (high ESR) low-short-circuit-current power source that is unable to directly power the drive of a solenoid is used to charge over time a low-equivalent-series-resistance (low ESR) high-short-circuit-current power accumulator. This accumulator typically consists of one or more electrolytic capacitors. An unaddressed power accumulator will, when its stored energy is summarily drained as a high-current, high-power pulse, serve not only to reliably actuate a solenoid or like device, but will actually produce a superior, energy-conserving, waveform for so doing.

This power accumulator, or electrolytic capacitor(s), would leak a considerable amount of the energy stored therein, wasting energy to the overall system, but for another aspect of the present invention. Namely, the energy-accumulating high-power solenoid driver is not supplied even with the low-power control signals until a period of time shortly before the solenoid is to be actuated. It is tri-stated to the low-power "control" signals by which it is supplied with energy. A circuit is "tri-stated" when it presents a high impedance to either a positive or a negative signal. These low-power control signals are normally 0 v.d.c., or "off", at all times up to a few hundred milliseconds before the solenoid is to be actuated by a discharge of stored energy. Once discharged, the high-power solenoid driver is not intended to, and does not, store energy in the intervals between its use. Accordingly, absolutely no power is supplied to, or expended by, or lost in, the energy-accumulating high-power solenoid drivers, nor in the occasionally long lines connecting thereto, during typically long time intervals between typically short periods of use. A dormant solenoid driver will come "alive" and on-line in an orderly fashion, taking only such modest energy as it needs to control its orderly accumulation of energy, only upon those times when it is individually selectively addressed, and powered, for purposes of the incipient actuation of a solenoid (or other connected device requiring a high-power pulse).

The low-power signals that are supplied to an energy-accumulating high-power solenoid driver are, unfortunately but quite commonly, possessed of a voltage, typically about 4.5 v.d.c., that is lower than is desirable (regardless of any associated current, and power) for the drive of a common solenoid. In accordance with still another aspect of the present invention, the voltage of the low-power control signals is multiplied (doubled) during a process of energy accumulation on two electrolytic capacitors. The accumulated charge on both electrolytic capacitors is used to drive the solenoid, producing a pulse of proper voltage. Moreover, the current of the pulse is optimized, being much higher initially than afterwards. The energy-accumulating high-power solenoid drivers of the present invention therefore do more than merely accumulate power; they effectively develop a pulse having such proper voltage and current waveforms, as well as the correct total energy, as are needed to optimally, and most efficiently, drive the solenoids. The quality waveforms of the high-power pulse ensure reliable optimized delivery of power to the load, and, more importantly, use energy optimally with minimal waste.

As still another aspect of the present invention, a plurality of energy-accumulating high-power solenoid drivers are individually selectively addressable. Moreover, they are so addressable by the identical selfsame "control" signals that are elsewhere, and otherwise, used to transfer power, one solenoid driver at a time, to selected ones of the solenoid drivers. In order to so function each solenoid driver takes a minute amount of power from the "control" signals in order to energize its logic circuitry; thereby to determine whether or not it is being addressed. (This power is accumulated in an energy store—a small capacitor—that is independent of and separate from the drive energy store, or large electrolytic capacitors.) Only the uniquely addressed one of the many energy-accumulating high-power solenoid drivers will further gate the substantial energy of the "control" signals to its drive energy store (its electrolytic capacitor(s)).

The remotely-powered and remotely-addressed solenoids that are electrically connected in parallel, and in daisy-chain fashion, incorporate a certain "intelligence", typically in the form of a microprocessor. This "intelligence", located at all the sites of all the solenoids (which solenoids may be spatially or geographically widely distributed) is at some component cost. However, because of this "intelligence" power may be supplied to many energy-accumulating high-power solenoid drivers in electrical parallel, and at low ohmic power losses (proportional to the square of the current I, which is low) through inexpensive wire. The parallel connection of many dozens of solenoids over areas of many acres may typically be realized by 16, or higher, gauge wire. The length of the wire, and the cost of its installation, is much reduced from previous hub-and-wheel connections because the wired connection is as a daisy chain.

The "intelligence" present at the sites of the solenoids, although primarily useful for the addressing of the solenoids, offers new, heretofore unrealized, advantages. Any phenomena that is produced attendant upon the solenoids' actuations, such as, for example, the gating of irrigation water at differing flow rates and/or volumes, may be sensed and then communicated to a central controller/computer/source of power. This communication transpires through the selfsame lines that are, at other times, used to communicate addressing information, and to supply power. The communicated information permits feedback control of the sensed phenomena.

The useful dissemination and distribution of "intelligence" is at a low energy cost. Just as a central controller/computer/source of power rations power and energy, through the energy-accumulating high-power solenoid drivers of the present invention, to the solenoids that it causes to be actuated, so also is this central controller/computer/source of power the ultimate source of energy for any microprocessor and/or sensors that may accompany the solenoid. Just as with the solenoid itself, these electronic devices are budgeted energy, and are designed so as not to waste energy.

The plethora of aspects, and attributes, of the present invention all have a common purpose. In every way, and at every location, where the circuits of the prior art commonly lose energy by (i) misapplication (inefficient use), or (ii) leakage (waste), the circuit of the present invention conserves energy. By such rigorous conservation it is estimated that 90+% of the energy expended in solenoid drive by the high-equivalent-series-resistance, low-short-circuit-current, power source of the "control" signals is ultimately delivered—and is well-delivered in waveforms of optimal voltage, current, and duration—to a selected solenoid(s).

This high efficiency permits, for example, that a solar array or other minuscule source of power such as a nominal 6" by 4" photo voltaic array, receiving ambient light year-round in all weather conditions, may actually power a reasonable number of actuations, at any time of day or night, for example 64 such actuations, among a number, nominally 8, solenoids of modest size. Each such modestly-sized solenoids is suitable, for example, to gate the flow of irrigation water in lines of up to several inches in diameter at up to 300 p.s.i. pressure. The resultant macroscopic physical phenomena—the control of large, and highly visible, irrigation water flows—have not heretofore commonly been deemed possible of being controlled with only the such insignificant energy as is contained in ambient light falling upon a small area. However, the present invention shows that careful energy management can produce big effects from very tiny energy sources.

These and still other aspects and attributes of the present invention will become increasingly clear upon reference to the following drawings and accompanying specification.

BRIEF DESCRIPTION OF THE DRAWINGS

FIG. 1 is a first-level block diagram showing the principles of a remotely-energized energy-accumulating high-power driver in accordance with the present invention.

FIG. 2, consisting of FIG. 2a and FIG. 2b, is a general waveform diagram showing two alternative waveforms for the low-power signals which are used to charge an energy-accumulating high-power driver in accordance with the present invention, and the final drive pulses resultant from each such charging waveform.

FIG. 6, consisting of FIGS. 6a through 6e, is a detail waveform and timing diagram showing the excitation of the first variant embodiment circuit of FIGS. 2 and 3 by a relatively short unipolar pulse, and the low-current low-power drive pulse generated in response to such excitation.

DESCRIPTION OF THE PREFERRED EMBODIMENT

Figure 3:
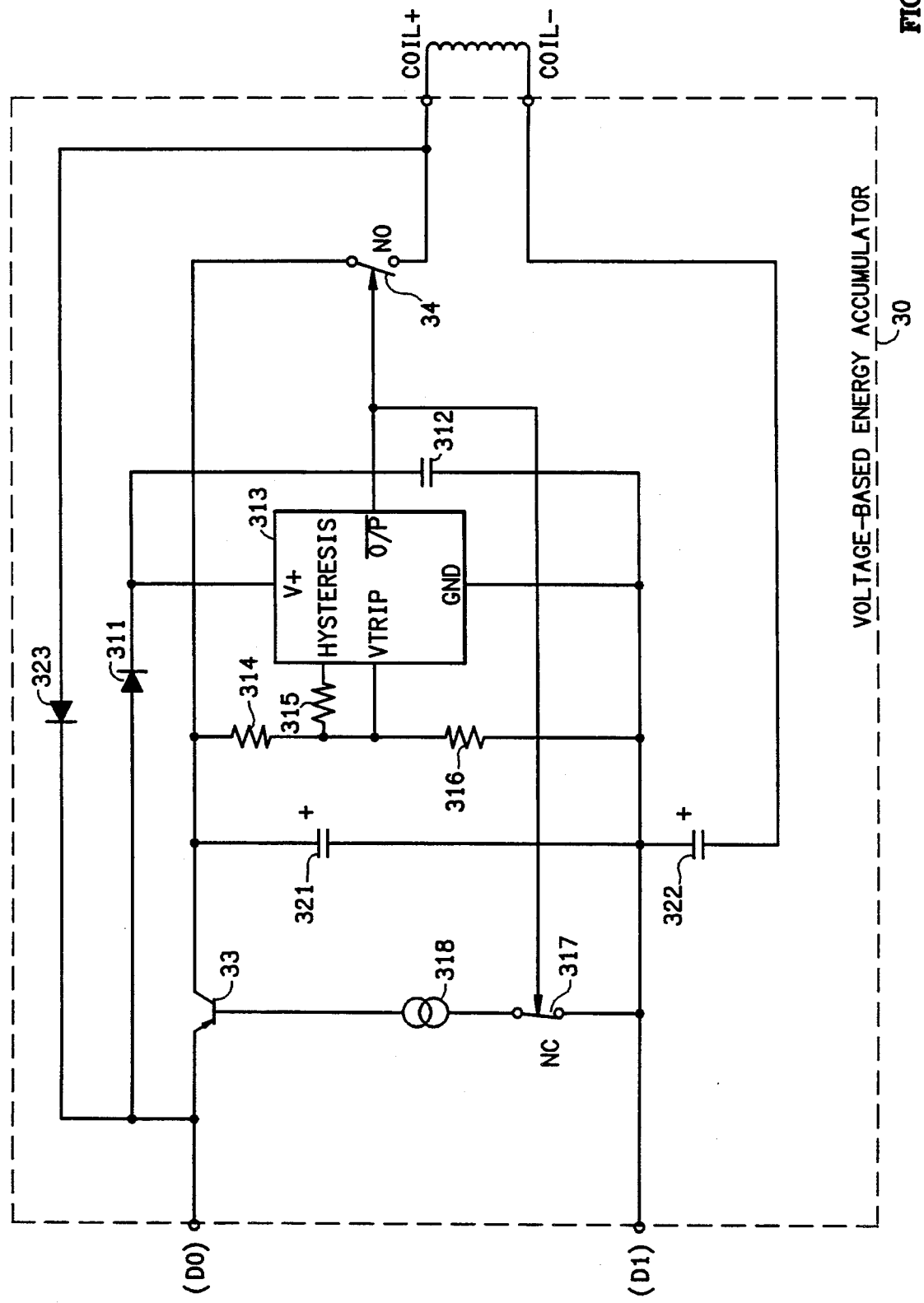
FIG. 3 is a second-level block diagram of a first variant embodiment, or voltage-based charge accumulator, of an energy-accumulating high-power driver in accordance with the present invention.

A first-level block diagram of the present invention, particularly useful for considering the wider, system-level, aspects of its application, is shown in FIG. 1. A CONTROL SYSTEM 1 such as, for example an irrigation control system such as is taught in U.S. patent application Ser. No. 255,150 (the contents of which are incorporated herein by reference) desires to drive a LOAD 2 such as, for example, the coil of a solenoid which may, for example, actuate a solenoid valve (not shown). The CONTROL SYSTEM 1 typically has a HIGH INTERNAL-SERIES-RESISTANCE (HIGH ISR) LOW-SHORT-CIRCUIT-CURRENT POWER SOURCE. Such a power source may be, for example based on multiple insulating layer carbon paste electrode capacitors, commonly called "supercapacitors", such as is taught in the previously mentioned patent application. The POWER SOURCE 11 is typically powered from an EXTERNAL SUPPLY 3, which may be a photo voltaic module (PVM).

The POWER SOURCE 11 commonly contains enough energy so as to, if efficiently used, produce many instances of a signal suitable to drive the LOAD 2. Alas, the high internal series resistance of the POWER SOURCE 11 limits the maximum short circuit current that it can supply, and the maximum power of its output. A power source of low internal resistance, such as a battery, is not desired because it loses too much energy by self-discharge, or leakage mechanisms (particularly at elevated temperatures), and is inefficient compared to a POWER SOURCE 11 of high equivalent series resistance. (Nonetheless to the undesirability, and energy losses, of batteries, batteries are commonly associated with conventional solenoid drivers in order to supply energy thereto. The present invention will show how to avoid the expense, maintenance, and energy losses associated with separate battery power sources for the drive of loads including solenoid coils.)

Instead, the POWER SOURCE 11 normally drives, and powers, only CONTROL LOGIC 12, which consume power at but a very small rate in relationship to the drive of LOAD 2, typically at a rate which is smaller by two orders of magnitude or more. In accordance with the present invention, the POWER SOURCE 11 is also used to power a LOW_POWER DRIVE CIRCUIT 13. This LOW-POWER DRIVE CIRCUIT 13, while potentially consuming several multiples of the power used by the CONTROL LOGIC 13 in commensurately large-area low-power signal line drive transistors, is still manifestly insufficient to directly drive the LOAD 2.

In accordance with the present invention, the LOW-POWER DRIVE WAVEFORMS (D0) and (D1) that can be produced by the LOW-POWER DRIVE CIRCUIT 13, and by its POWER SOURCE 11, will have their energy accumulated in a new ENERGY-ACCUMULATING HIGH-POWER DRIVER 3. Energy accumulation is not new. Energy accumulation (normally from the energy of a battery) in order to release the accumulated energy and drive with a high current pulse of high power a load, such as a solenoid's coil, is not new. It is not even new to gate the accumulated energy as the high-power drive pulse.

It is other things that should be considered in studying the ENERGY-ACCUMULATING HIGH-POWER DRIVER 3.

First, where does the energy for its operation come from? The answer is: a high ESR supply, and not a battery.

Second, how does the energy so come? The answer is: as a bipolar waveform signal or as a unipolar waveform signal, as a high- or a low-power final drive signal is respectively required.

Third, when does the energy so come? The answer is: only when needed, and not otherwise nor at other times—necessitating "cold start" operation.

Fourth, what other use is made of the supplied energy? The answer is: addressing, according selective actuation of one only of plurality of energy-accumulating high-power drivers that are electrically connected in parallel.

Fifth, which adaptations, if any, are made to the supplied low-energy signals during their accumulation to produce a high-current high-energy pulse? The answer is: their voltage is multiplied. Specifically, it is doubled. Moreover, the waveform of the final drive signal is much altered from the low-power signals from which its energy is accumulated.

Continuing in FIG. 1, the signals from the LOW-POWER DRIVER CIRCUITS 13 are tri-stated, and completely controllable in both (i) polarity and (ii) duration. The LOW-POWER SIGNALs drive zero (D0) and drive one (D1) are typically developed in the two patterns shown in FIG. 2a or FIG. 2b dependent upon whether the FINAL DRIVE is desired to be a positive-going pulse of high energy, of a negative-going pulse of lessor energy. Control of the (i) polarity and (ii) power of the FINAL DRIVE pulses by the (i) polarities and (ii) durations of the input LOW-POWER SIGNALs is extremely useful: a positive-going high-power FINAL DRIVE is exactly what is required to energize a solenoid to pull in while a typically much less energetic negative-going FINAL DRIVE pulse is sufficient to energize the same solenoid to release. The particular energizing pulses required by a particular solenoid are, of course, a function of the electrical and mechanical design of such solenoid, and the mechanical load to which it is coupled. Nonetheless, it is clear that the scheme of the present invention is flexible to produce FINAL DRIVE pulses of tailored polarity and energy. This is, as aforesaid, extreme useful for both (i) reliable system operations, and (ii) optimal energy conservation.

The tri-stated LOW POWER SIGNALs (D0) and (D1) are received at ADDRESSING AND LOW-POWER SIGNAL GATING CONTROL LOGIC. The power within the LOW-POWER SIGNALs separately powers these logic 31 regardless of the selective energizing of LOW-ESR HIGH-SHORT-CIRCUIT-CURRENT ENERGY ACCUMULATOR 32 by gating occurring in LOW POWER GATE 33. In an addressed ENERGY-ACCUMULATING HIGH-POWER DRIVER 3 the LOW-POWER GATE 33 will gate the LOW-POWER SIGNALs to the ENERGY ACCUMULATOR 32 where their energy will be stored, typically on electrolytic capacitors 321, 322. For a first, negative, polarity of LOW POWER SIGNAL (D0) relative to LOW-POWER SIGNAL (D1), the capacitor 322 is first charged by a path proceeding through the coil of LOAD 2. For a second, positive, polarity of LOW POWER SIGNAL (D0) relative to LOW-POWER SIGNAL (D1), the capacitor 321 is second charged by a path proceeding through the LOW-POWER GATE 33. The voltage across both the capacitors 321, 322 is a multiple, namely two times, the individual voltages between LOW-POWER SIGNAL (D0) and (D1) which were used, at different times, to charge each such.

Energy accumulation can proceed for a predetermined period of time, or, as is indicated by the dashed-line signal SENSE shown in FIG. 1, until a predetermined charge has been sensed by LOGIC 31 to have accumulated on the capacitor 321 of ACCUMULATOR 32. At this time the LOW POWER GATE 33 is turned off, isolating the CONTROL SYSTEM 1 from transients During production of the FINAL DRIVE pulse. The LOGIC 31 turn on the HIGH POWER GATE 34, and the stored energy on the capacitors 321,322 flow to LOAD 2 as a FINAL DRIVE pulse of typically high current and power.

A general waveform diagram showing a voltage waveform between LOW-POWER SIGNALs (D0) and (D1) which is used to charge ENERGY-ACCUMULATING HIGH-POWER DRIVER 3 to produce a positive FINAL DRIVE pulse of high power is shown in FIG. 2a. The charging waveform is initially negative-going, and is subsequently positive going, between the two SIGNAL lines. A voltage waveform between LOW-POWER SIGNALs (D0) and (D1) which is used to charge ENERGY-ACCUMULATING HIGH-POWER DRIVER 3 to produce a negative FINAL DRIVE pulse of lower power is shown in FIG. 2b. The charging waveform is negative-going, and of a duration that is typically less than either the positive-going or the negative-going waveforms of FIG. 2a. The FINAL DRIVE pulse of FIG. 2a is typically used to more strongly power a solenoid for one direction of its actuation and to less strongly power the solenoid for the other direction of its actuation. This differential in required drive, and in resultantly the produced force, is typically required by external mechanical load forces (e.g., return spring force, pressure force, and/or force to overcome over-center latching mechanisms) operating on the solenoid plunger. Tailoring the produced drive pulses to the selective actuation requirements of the solenoid conserves energy.

A lower-level block diagram of a first variant embodiment, or VOLTAGE-BASED CHARGE ACCUMULATOR 30, of an ENERGY-ACCUMULATING HIGH-POWER DRIVER 3 in accordance with the present invention is shown in FIG. 3. A negative signal (DO) relative to (D1) is passed through steering diode 323 and through the LOAD 2 consisting of a coil to charge electrolytic capacitor 322. A positive signal (D0) relative to (D1) passes through diode 311 to charge small electrolytic capacitor 312, thereafter to appear across and to power the logic and sense circuit 313. In accordance with a predetermined bias to this logic and sense circuit 313 established by resistors 314–316 which are connected as a voltage divider across the electrolytic capacitor 321, the circuit will enable via normally-closed switch 317 a constant-current power supply 318 to produce a voltage on the base of transistor LOW-POWER GATE 33. (The constant current power supply, or bias source, 318 is a superior way of maintaining the transistor LOW-POWER GATE 33 fully conducting until intentionally shut off.) The conducting state of transistor LOW-POWER GATE 33 enables the charging of the second electrolytic capacitor 321.

After logic and sense circuit 313 detects that the voltage on the electrolytic capacitor 321 has reached a predetermined threshold level it will, regardless of any continuance of a positive-voltage charging waveform between signals (D0) and (D1), disable the switch 317, causing transistor LOW-POWER SWITCH 33 to open. The further charging of electrolytic capacitor 321 now suspended. The same signal that operated to close normally-closed switch 318 will act to close normally-open HIGH-POWER GATE 34. This closure will gate the combined charge that is upon both electrolytic capacitors 321 and 322 as a HIGH POWER DRIVE pulse appearing between signals COIL+ and COIL−, and across the LOAD 2 in the nominal form of a solenoid's coil. Loads of other, differing, types may, of course, also be driven by an ENERGY-ACCUMULATING HIGH-POWER DRIVER 3 in accordance with the present invention.

Figure 4:
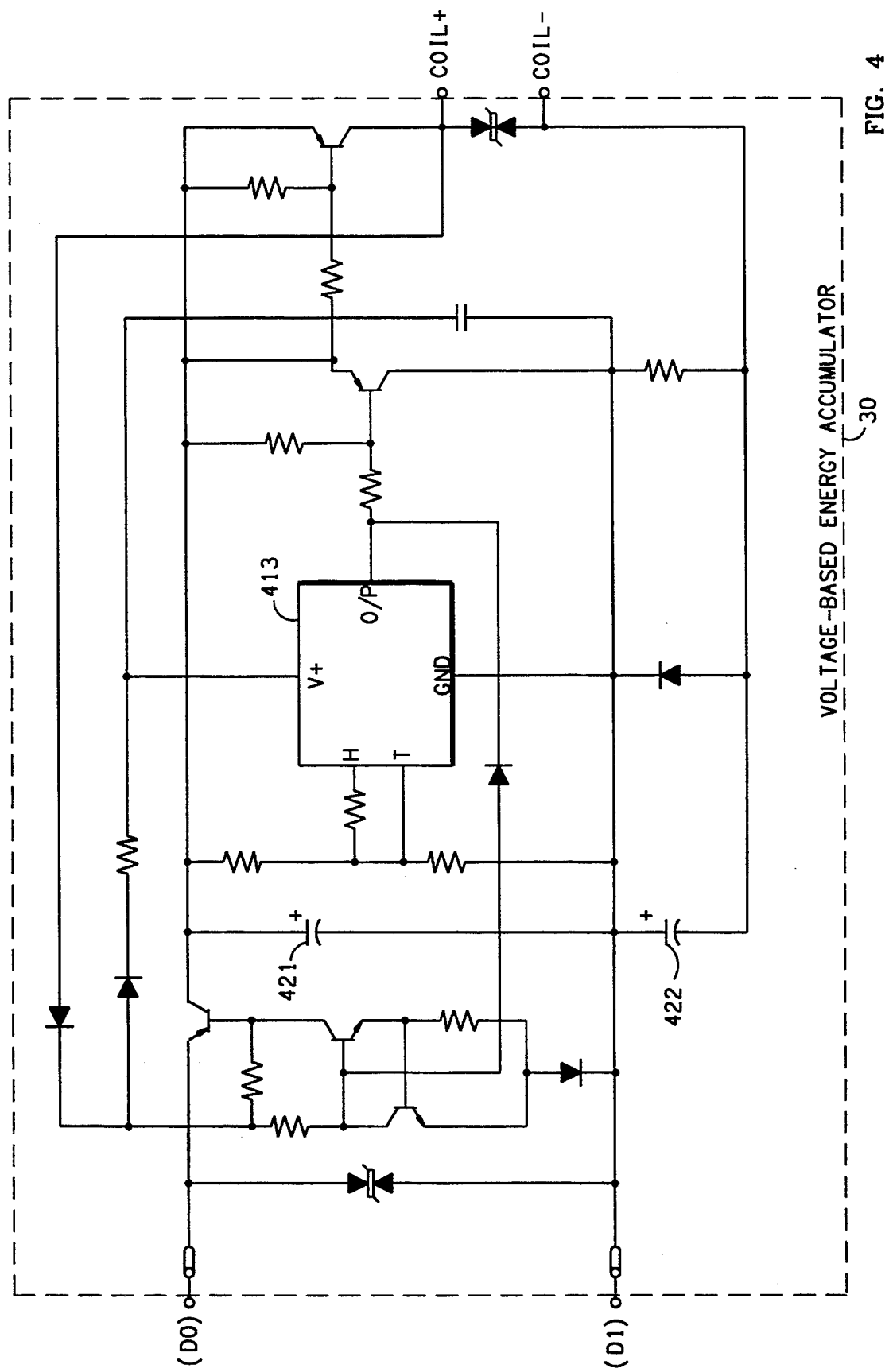
FIG. 4 is a schematic diagram of the first variant embodiment, or voltage-based charge accumulator, of an energy-accumulating high-power driver in accordance with the present invention previously seen in the block diagram of FIG. 2.

A complete schematic of the VOLTAGE-BASED ENERGY ACCUMULATOR 30, which schematic should be interpretable in accordance with the explanation just given is shown in FIG. 4. Transorbs are located across the input (charging) and output (drive) signal ports for purpose of transient suppression, and protection against overvoltages. The drive of the HIGH-POWER SWITCH 34 (shown in FIGS. 2 and 3) may be observed to be of a Darlington configuration. The resistor bias of sense and logic chip U1 type MAX8212CPA is predetermined so as to produce from the input charging waveforms shown at the beginning of FIGS. 5 and 6 the output drive pulses that are likewise shown at the end of each such FIG. 5 and 6.

Figure 5A:
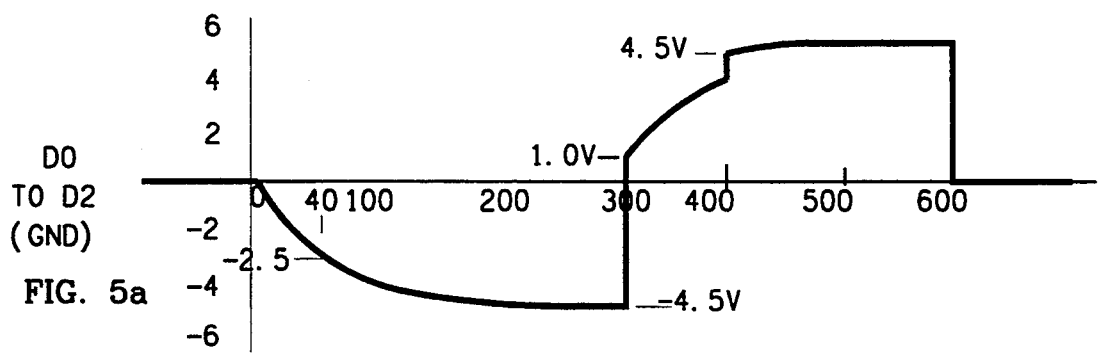
FIG. 5, consisting of FIGS. 5a through 5g, is a detail waveform and timing diagram showing the excitation of the first variant embodiment circuit of FIGS. 3 and 4 by a relatively long bipolar pulse, and the high-current high-power drive pulse generated in response to such excitation.
Figure 5B:
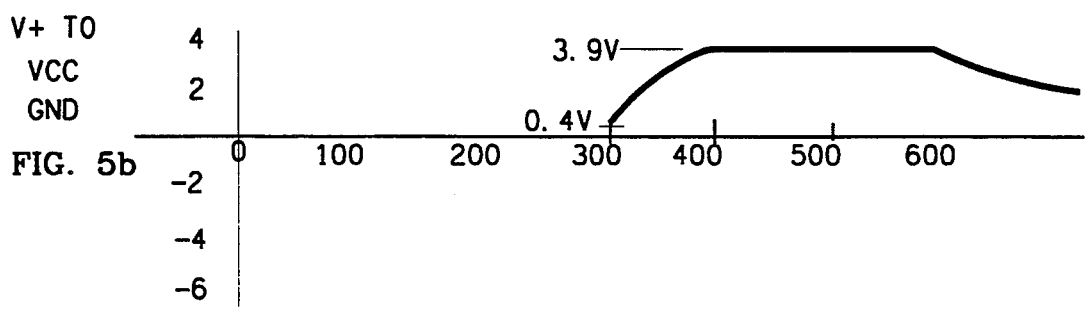
Figure 5C:
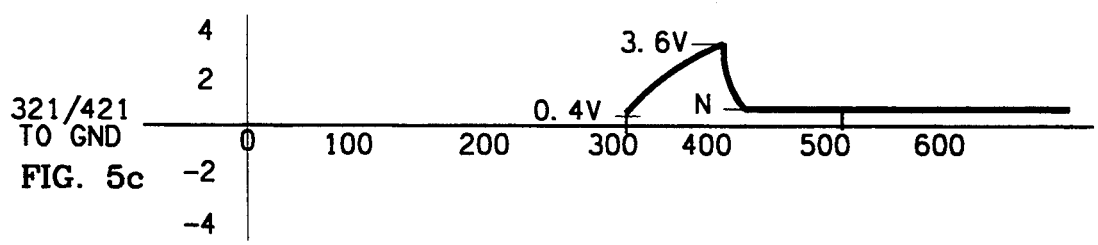
Figure 5D:
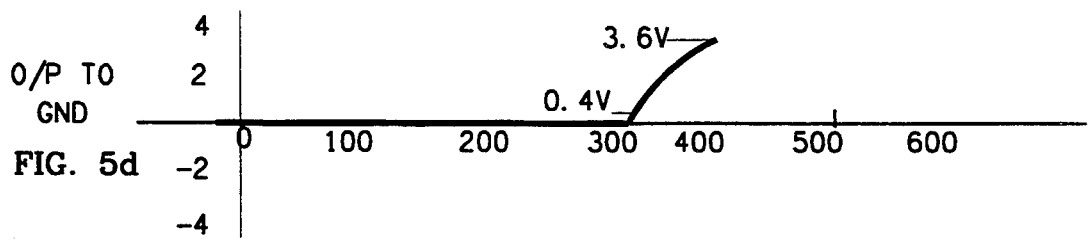
Figure 5E:
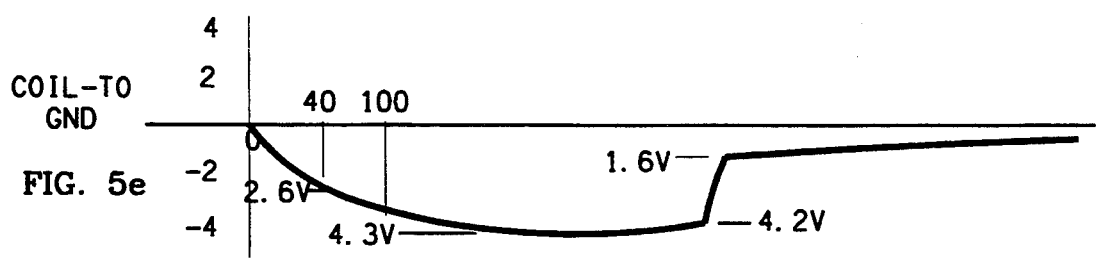

In particular, FIG. 5a shows a relatively long bipolar pulse as may appear between signal lines D0 and D1 in either the circuit embodiments of FIGS. 3 and 4. FIG. 5b shows the resulting voltage V+ that will appear across the chips 313, 413 (as are respectively shown in FIGS. 3 and 4). FIG. 5c shows the resulting voltage that will appear across first capacitor 321, 421 (as are respectively shown in FIGS. 3 and 4). FIG. 5d shows the output pulse O/P that will responsively be generated by either of the chips 313, 413 (as are respectively shown in FIGS. 3 and 4). FIGS. 5e, 5f and 5g respectfully show the voltage that will appear between each of the COIL− an COIL+ signal and ground (GND), and between the COIL− an COIL+ signals, as these signals are shown in each of FIGS. 3 and 4.

Likewise, FIG. 6a shows the application of a relatively short unipolar pulse as input signal D0 to D1 in either of the circuit embodiments of FIGS. 3 and 4, while FIGS. 6b and 6c respectively show the COIL− to ground, and the COIL+ to ground, signals that will result from such a relatively short, unipolar, input signal.

It should be noted that all energy for the ENERGY-ACCUMULATING HIGH-POWER DRIVER 3 is supplied only when needed, immediately prior to the generation of a high-power drive pulse. No energy is supplied otherwise nor at other times. This operation necessitates a "cold start" capability, which is admirably met by the circuit of the ENERGY-ACCUMULATING HIGH-POWER DRIVER 3 including its capacitor 312 (shown in FIG. 3) which may be considered a third store of energy to the larger stores of electrolytic capacitors 321 and 322 (also shown in FIG. 3).

It is within the ability of practitioner of the art of electrical circuit design to adjust the circuit of FIG. 4 in many ways, and to energize it from the CONTROL SYSTEM 1 (shown in FIG. 1) in many different manners.

For a first example, the energy for operation of the ENERGY ACCUMULATING HIGH-POWER DRIVER 3 preferably comes from a high-ESR power supply, and not a battery. However, the circuit could be powered from a battery, or directly from a low-level source of power such as, for example, a solar panel.

Figure 7:
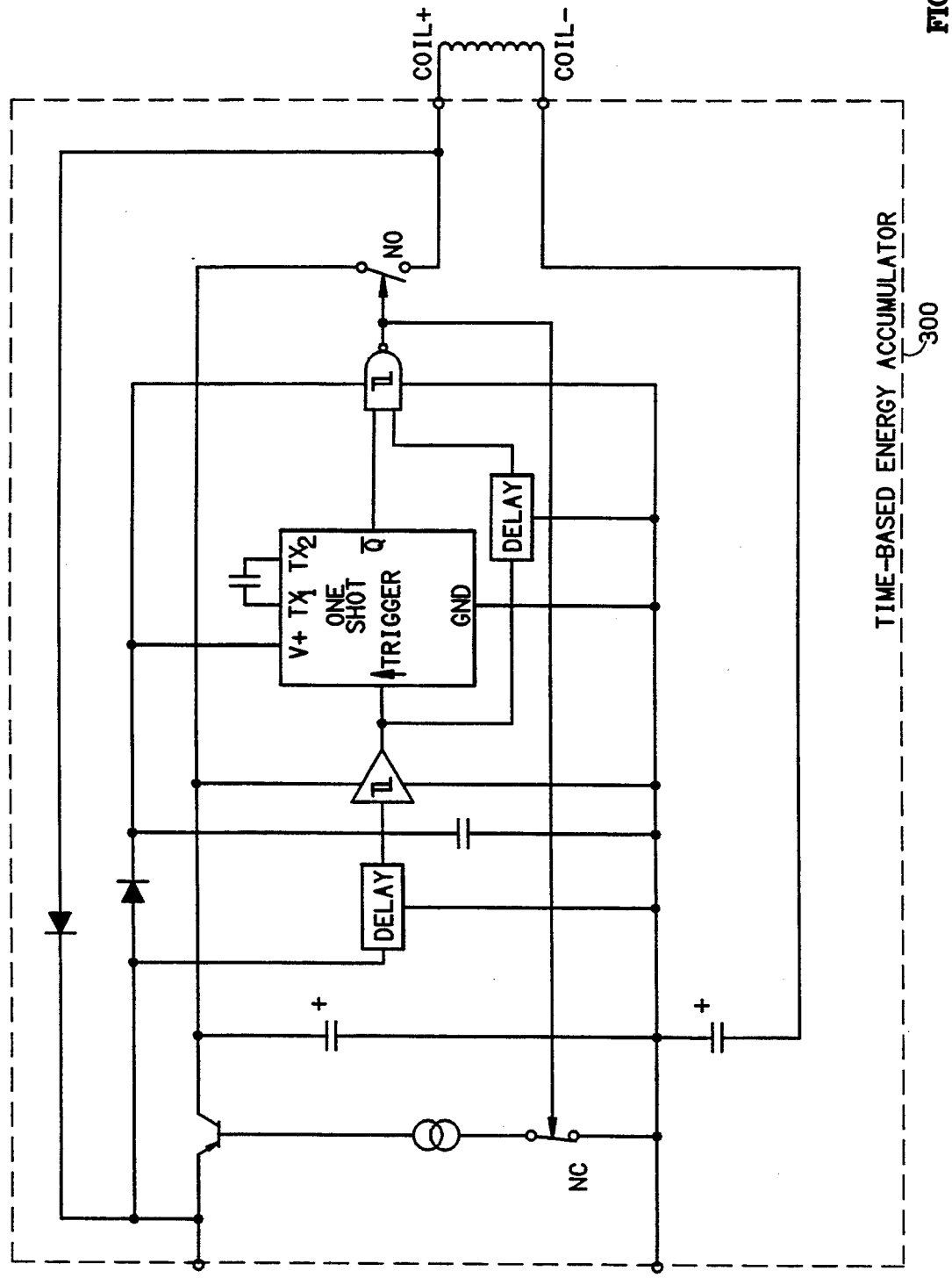
FIG. 7 is a second-level block diagram of a second variant embodiment, or time-based charge accumulator, of an energy-accumulating high-power driver in accordance with the present invention.

As a second example, the charging energy can come as a bipolar waveform signal as is shown in FIG. 5, or as a unipolar waveform signal as is shown in FIG. 7, respectively as the high- or the low-power final drive signals also shown within those Figures are required or desired.

As a third example, it will be noted that adaptations have been made to the voltage, and to the current, waveforms of the received low-energy signals—as well as their accumulation to produce a high-current high-energy pulse. The voltage has multiplied, and has specifically been doubled. Moreover, the current waveform of the final drive signal is much altered from the low-power signals from which its energy is accumulated. It must be understood that, by use of multivibrator, the voltage could be more than doubled. The output current waveform is a function of the load impedance, and of the capacitance of the electrolytic capacitors. (Capacitors need not be charged to their maximum capacities.) By judicious use of standard circuit analysis the circuit shown in the schematic of FIG. 4 will be found to be readily be tailored to a specific pulsed-drive application, and not to constitute just a fixed design that needs be applied unaltered for all purposes. Carefully tailoring is particularly useful to produce drive waveforms of optimal interaction with the driven loads (i.e., which cause the loads to reliably respond as intended and desired), and to conserve energy by using no more (nor any less) than is required.

A possibly less-obvious modification and adaptation of the ENERGY-ACCUMULATING HIGH-POWER DRIVER 3 shown in block diagram in FIG. 1 is in its second variant embodiment of a TIME-BASED ENERGY ACCUMULATOR 300 shown in block diagram in FIG. 7. Similar to the VOLTAGE-BASED ENERGY ACCUMULATOR 30 previously seen in FIGS. 3 and 4, the TIME-BASED ENERGY ACCUMULATOR 300 accepts a charging waveform for only a predetermined period of time. Thereafter the ACCUMULATOR 300 disconnects from the charging waveform, and gates its stored energy as a high-power drive pulse.

Figure 8:
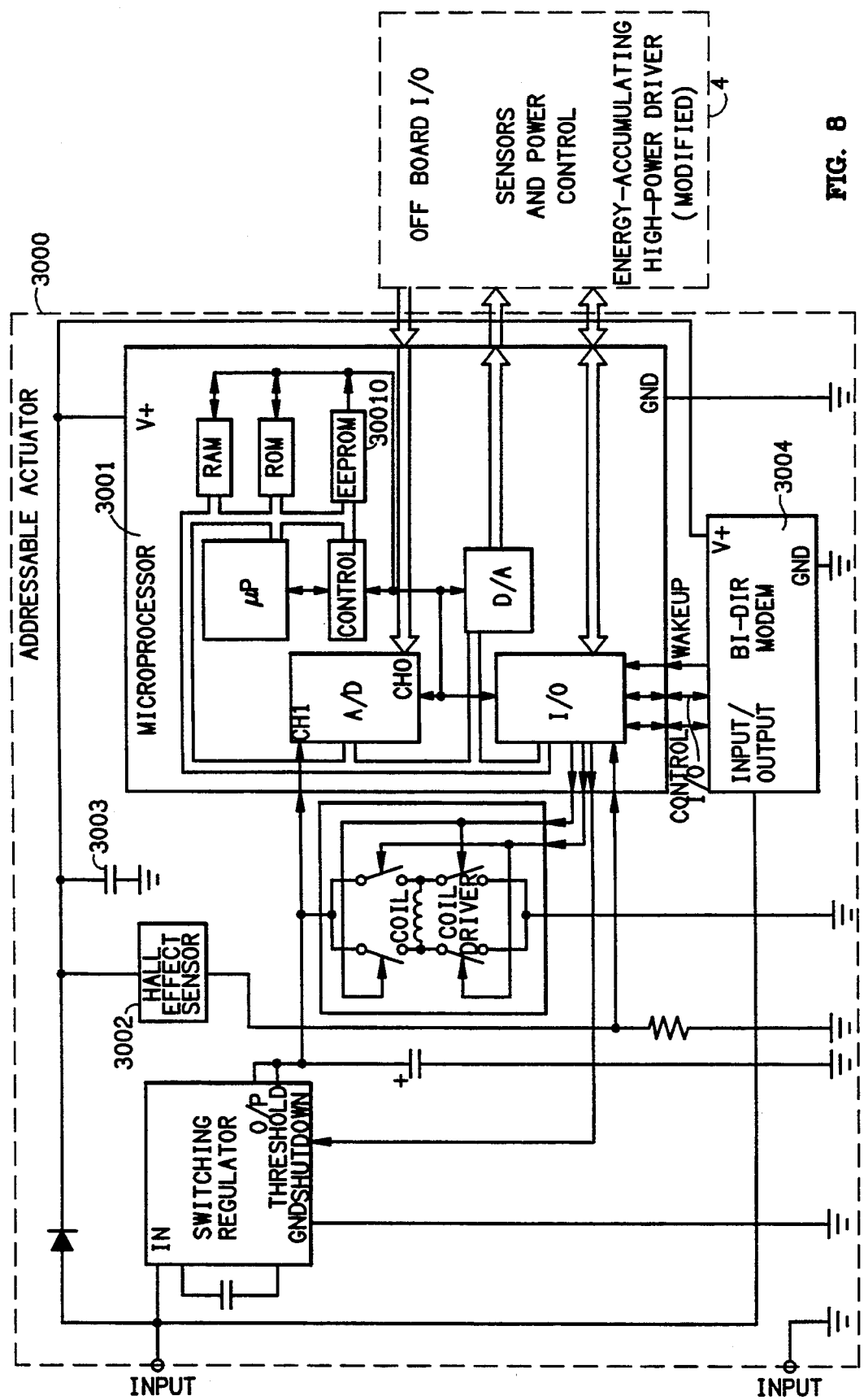
FIG. 8 is a second-level block diagram of an addressable actuator in accordance with the present invention interactively operative with a third variant of an energy-accumulating high-power driver in accordance with the present invention.

A major extension of the present invention, involving another, additional, use of the signals which supply the energy to the ENERGY-ACCUMULATING HIGH-POWER DRIVER 3 (shown in block diagram in FIG. 1) is shown in block diagram form in FIG. 8. This new, and expanded, variant embodiment contemplates addressing among a plurality, typically four or more, of energy-accumulating high-power drivers that are electrically connected in parallel. The addressing is for the purpose that one only of such energy-accumulating high-power driver should be, at any one time, enabled for producing a high-power drive pulse. This new, and expanded, variant embodiment further contemplates sensing and reporting phenomena to a central controller/computer/source of power through the same signal lines that are at other times used for (i) addressing, and (ii) supplying power The third variant, addressable, embodiment of the invention shown in FIG. 8 includes (i) a modified energy-accumulating high-power driver in accordance with the present invention, and (ii) an ADDRESSABLE ACTUATOR 3000 also in accordance with the present invention. The ADDRESSABLE ACTUATOR 3000, operating under control of a MICROPROCESSOR 3001 to gate low power supplied across an INPUT to an ENERGY-ACCUMULATING HIGH-POWER DRIVER (MODIFIED) 4. This ENERGY-ACCUMULATING HIGH-POWER DRIVER (MODIFIED) 4 is a modification to the ENERGY-ACCUMULATING HIGH-POWER DRIVER 3 previously seen in FIG. 1 and, for example, to either the voltage- or time-based types respectively previously seen in FIGS. 4 and 7, for including sensors and I/O capability as well as energy storage and control capacity.

Figure 9:
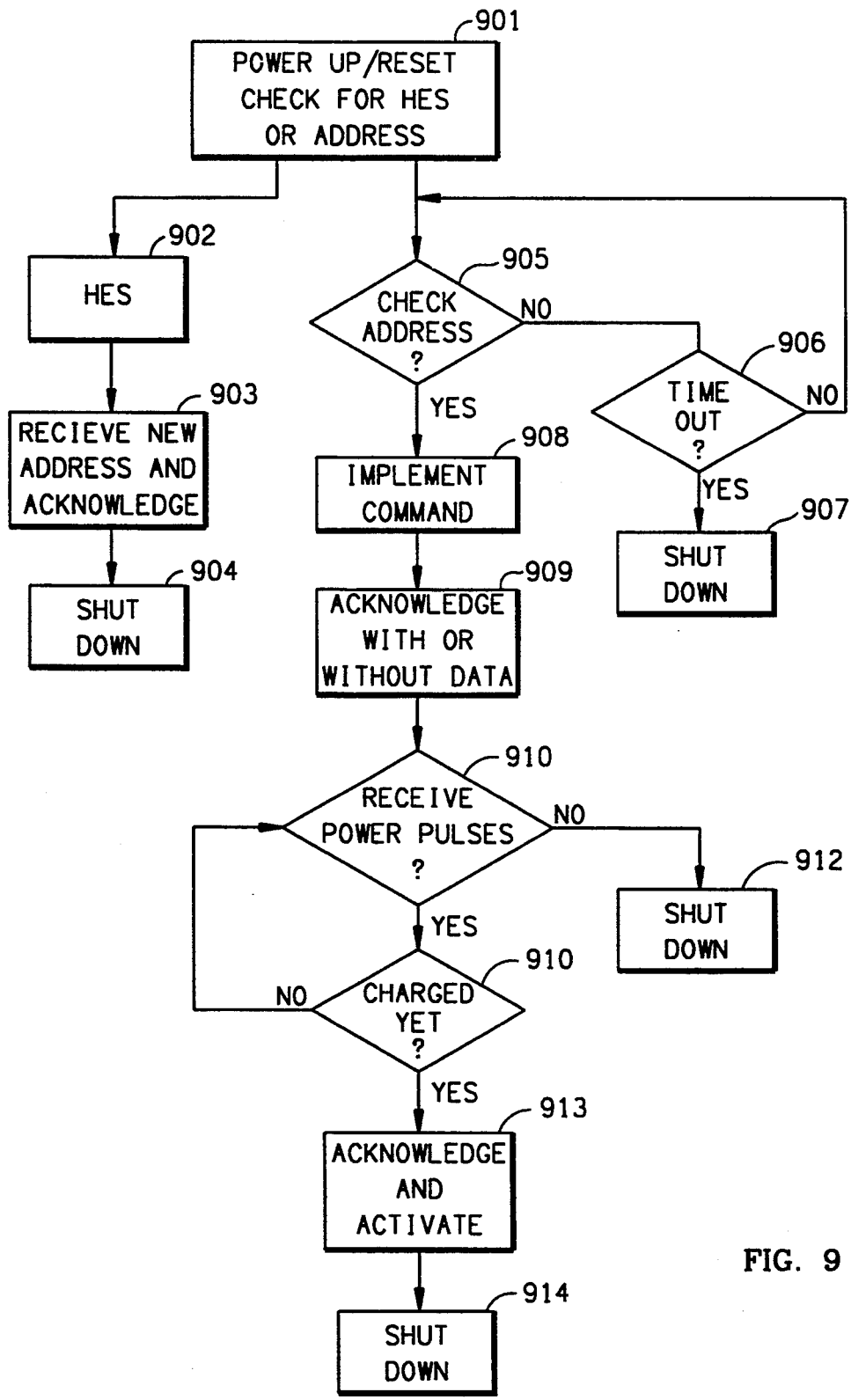
FIG. 9 is a flowchart of a software program running in the addressable actuator in accordance with the present invention that was previously seen in FIG. 8.

The MICROPROCESSOR 3001 executes the software program that is flow-charted in FIG. 9. In accordance with the flowchart, during each power-up sequence a HALL EFFECT SENSOR 3002 (shown in FIG. 8) is evaluated so as to determine if a user has temporarily placed a magnet in close proximity to the SENSOR 3002. If so, then the ADDRESSABLE ACTUATOR 3000 will receive on the INPUT communication (and power) lines a new address from the controller/computer/source of power (not shown) to which it is connected.

In particular, the FIG. 9 flow chart of the software program running in the addressable actuator in accordance with the present invention—previously seen in FIG. 8—starts at block 901 in either a power up or reset condition with a checking for any magnetic actuation of a Hall Effect Sensor (HES), which actuation indicates that an address is to be received. If, by local magnetic actuation of an attached HES, a sensor or actuator address is to be received, then it is so received and acknowledged in blocks 902-904. The MICROPROCESSOR 3001 (shown in FIG. 8) then returns to its shut down condition.

If, however, in FIG. 9 an address is sensed upon the input lines (shown in FIG. 8), then this address is checked with the local, previously-assigned, actuator and/or sensor addresses in block 905. If no local actuator and/or sensor is being addressed then, after a time-out interval of regarding the address lines in block 906, the MICROPROCESSOR 3001 (shown in FIG. 8) will return to its shut-down condition in block 907. If, to the contrary, a local actuator and/or sensor is being addressed then the command regarding same will be received and implemented in block 908, including with an acknowledgment and with the possible reporting of requested data (as would be the case for a sensor interrogation) in block 909.

Figure 10:
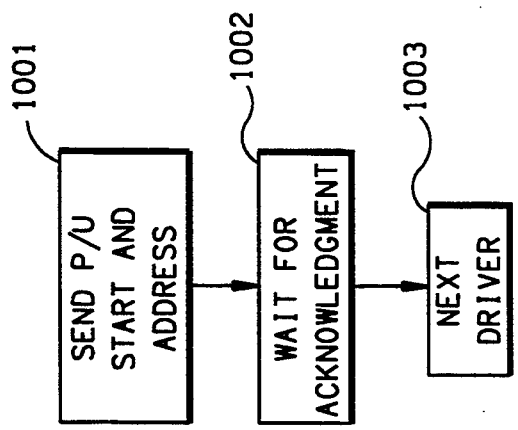
FIG. 10 is a flowchart of a first, initialization, software program running in a controller/computer/source of energy communicating with the addressable actuator in accordance with the present invention that was previously seen in FIG. 8, which addressable actuator is itself executing the software program that was previously seen in FIG. 9.

If an actuator is being both addressed and energized, then the decision, responsive to the command interpretation in block 908, to "receive power pulses" in block 910 will be yes, and such "charging" pulses will be received in block 911. Otherwise the MICROPROCESSOR 3001 (shown in FIG. 8) will shut down in block 912. At the completion of the charging an addressed actuator in block 911, the MICROPROCESSOR 3001 will be acknowledged and the actuator (such as, e.g., an electromagnetic irrigation valve) will be activated in block 913. At the completion of the actuation and acknowledgement of same the MICROPROCESSOR 3001 (shown in FIG. 8) again shuts down in block 914. Such a controller/computer/source of power is, at this time, executing the software program that is flow-charted in FIG. 10.

It is obvious that the program executing in the controller, computer, and/or source of energy that communicates with the addressable actuator (shown in FIG. 8) must be complimentary to, and interactive with, that software program that runs in the addressable actuator itself—which software program was just seen in the flow chart of FIG. 9. A first, initialization, software program running in the controller/computer/source of energy that is so interactive is flow charted in FIG. 9. This program sequence simply serves at power up (P/U) to poll all the addresses (whether actuators or sensors or whatever) in block 1001, to wait for an acknowledgment from each in block 1002, and to continue until all communicating devices—which are most commonly solenoid valve drivers—are verified and/or identified in block 1003.

Figure 11:
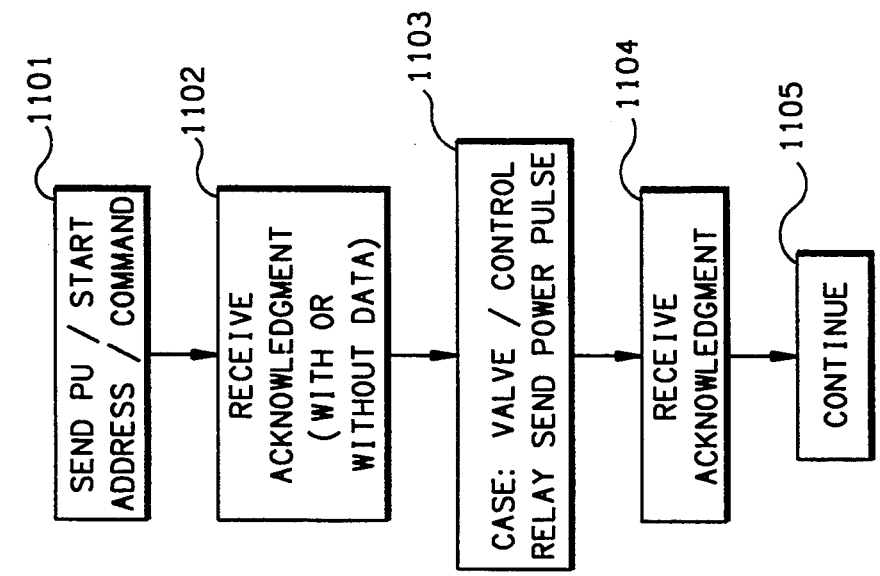
FIG. 11 is a flowchart of a second, operational, software program running in the controller/computer/source of energy communicating with the addressable actuator in accordance with the present invention that was previously seen in FIG. 8, which addressable driver is itself executing the software program that was previously seen in FIG. 9.

A software communication program sequence running in the controller/computer/source of energy communicating with the addressable actuator (previously seen in FIG. 8) is shown in FIG. 11. An address, new address, and/or command is sent in block 1101. An acknowledgement, which may or may not include return data, is received in block 1102. In the event that an actuator, nominally an actuator for an electromagnetic valve, is to be addressed and controlled then the addressing of the actuator must be followed, over time, by a power pulse in block 1103. It is by this power pulse that energy to actuate the valve may be accumulated in the (addressable) actuator (shown in FIG. 8). Only when acknowledgment is received in block 1104—indicating that the actuator has discharged its received energy and functioned to completion (see block 913 in FIG. 9)—will the software continue to other, or further, tasks in block 1105. Such a controller/computer/source of power may be, for example, the programmable controller with programmable tri-stated output drive that is taught within copending U.S. patent application Ser. No. 253,858 filed Oct. 4, 1988.

The transmitted address will be stored in the non-volatile EEROM 30010 of the MICROPROCESSOR 3001, thereafter to serve a unique identification of one ADDRESSABLE ACTUATOR 3000 and its associated ENERGY-ACCUMULATING HIGH-POWER DRIVER (MODIFIED) 4, out of a multiplicity of such that are connected in electrical parallel to the controller/computer/source of power. This process permits a user to arbitrarily specify, and re-specify, the particular logical address of any particular physical ADDRESSABLE ACTUATOR 3000, and its associated devices. This address initialization capability is useful, among other places, in large irrigation systems having numerous addressed, powered, and controlled solenoid valves.

In normal operation, the controller/computer/source of power executes the software program flow-charted in FIG. 11. It (i) sends out an initial energizing "pick-up" (PU) pulse to all ACTUATORS 3000, (ii) addresses and commands a particular one ADDRESSABLE ACTUATOR 3000, (iii) optionally receives back status and sensor data, and (iv) transmits a low power pulse or pulses for supplying energy to a selected ENERGY-ACCUMULATING HIGH-POWER DRIVER (MODIFIED) 4. The initial energization is stored in CAPACITOR 3003, which is preferably of the multiple-insulating-layer carbon paste electrode "super-capacitor" type and of approximately 0.0047 microfarad capacitance. Energy stored upon this capacitor is typically sufficient to power MICROPROCESSOR 3001, and through it D/A converter one or more sensors on the ENERGY-ACCUMULATING HIGH-POWER DRIVER (MODIFIED) 4, even if not selected, nor subsequently energized. Depending upon the programming of MICROPROCESSOR 3001, status and/or sensed conditions may be stored in its EEPROM 30010, or read back through the bidirectional BI-DIR MODEM 3004 to the controller/computer/source of power.

If selected, the ADDRESSABLE ACTUATOR 300 will gate power to the ENERGY-ACCUMULATING HIGH-POWER DRIVER (MODIFIED) 4, and may (optionally) subsequently control the discharge thereof.

In accordance with the preceding explanation, the present invention will be recognized to be broadly susceptible of modification while adhering to many of the principles of accumulation, voltage multiplication, tri-stated isolation, intermittent times of accumulation followed by an immediate discharge of accumulated energy, unpowered latency state, tailored drive waveforms, and/or selective addressing of energy accumulators as have been taught. For example, the energy-accumulating high-power drivers of the present invention are not limited to use with conventional solenoids and like devices requiring pulsed actuation, but may be both (i) used (i.e., connected to), and/or (ii) interoperatively used (i.e. connected alongside) ultra-low-power flux-switching electromagnetic actuators as are taught in copending patent application Ser. No. 388,059 filed Jul. 31, 1989 (the contents of which are incorporated herein by reference).

Accordingly, the invention should be broadly interpreted, in accordance with the following claims, only, and not solely in accordance with those particular embodiments within which the invention has been taught.

What is claimed is:

1. A power and energy management system for producing from a relatively lower power relatively lower voltage electrical signal of a relatively longer duration a relatively shorter duration electrical pulse having a relatively higher power and a relatively higher voltage, the system comprising:

a  high-equivalent-series-resistance low-self-discharge-current first energy storage means for producing a power output at a voltage relatively lower than an arbitrary voltage level, and at a power relatively lower than an arbitrary power level, over a first duration of time;

a dual polarity driver circuit means, receiving the relatively-lower-voltage relatively-lower-power output, for producing a signal, the signal also being of a relatively lower voltage than the arbitrary voltage level and of relatively lower power than the arbitrary power level, at each of two polarities;

a low power gating means, receiving the dual-polarity relatively-lower-voltage relatively-lower-power signal, for producing a charging signal also of a power that is relatively lower than the arbitrary power level but which signal has a voltage that is relatively higher than both the relatively-lower-voltage signal, and the arbitrary voltage level;

a  low-equivalent-series-resistance high-self-discharge-current second energy storage means, receiving the relatively-lower-power relatively-higher-voltage charging signal, for storing the energy in such received charging signal; and a high power gating means for, at the expiry of the first duration of time, controllably gating the energy stored by the second energy storage means as an electrical pulse over a second time duration that is relatively much shorter than the first time duration, the pulse having a voltage that is relatively higher than the arbitrary voltage, and the electrical pulse also having a power that is relatively higher than both the power output of the first energy storage means and the arbitrary power level;

wherein, because the relatively-lower-voltage relatively-lower-power output transpires during the first duration of time while the electrical pulse transpires during the second time duration after the expiry of the first time duration, no continuing power output is provided by the high-equivalent-series-resistance low-self-discharge-current first energy storage means after the occurrence of the relatively-higher-voltage relatively-higher-power electrical pulse.

2. The power and energy management system according to claim 1 wherein the high-equivalent-series-resistance low-self-discharge-current first energy storage means comprises:

a multi-insulating-layer capacitor.

3. The power and energy management system according to claim 1 wherein the low-equivalent-series-resistance high-self-discharge-current second energy storage means comprises:

an electrolytic capacitor.

4. The power and energy management system according to claim 1 wherein the low-equivalent-series-resistance high-self-discharge-current second energy storage means comprises:

two electrolytic capacitors.

5. The power and energy management system according to claim 1 further comprising:

a control circuit, responsive to the relatively-lower-voltage relatively-lower-power output, for controlling the low-power gating means to produce the relatively-lower-power relatively-higher-voltage charging signal only during such times as the high power gating means is not gating the energy stored by the second energy storage means as the electrical pulse, and for controlling the high power gating means to gate the energy stored by the second energy storage means as the electrical pulse only upon the lapse of such an interval of time as permits a predetermined amount of energy to be stored.

6. The power and energy management system according to claim 1 further comprising:

a third energy storage means, directly receiving the relatively-lower-power relatively-lower-voltage signal, for powering the control circuit;

wherein the control circuit is powered independently of the second energy storage means to which it gates power by the low-power gating means that it controls.

7. In an electrical system for producing a high power drive having a first energy storage means for producing an output signal at a voltage relatively lower than an arbitrary voltage level, and at a power relatively lower than an arbitrary power level, a signal driver circuit means, receiving the relatively-lower-voltage relatively-lower-power output signal, for producing a plurality of drive signals that are also of a voltage lower than the arbitrary voltage level, and of a power relatively lower than the arbitrary power level, and a plurality of remotely-powered high-power pulse drivers remotely situated from and powered by drive signals received from the signal driver circuit means, the improvement wherein each such pulse driver comprises:

a low-energy second energy storage means, receiving the relatively-lower-voltage relatively-lower-power drive signals, for storing power and energy therefrom;

a low-power gating means, powered by the second energy storage means and receiving at least one of the plurality of drive signals, for controllably gating at least one drive signal received as a charging signal still having a power relatively lower than the arbitrary power level;

a low-equivalent-series-resistance high-self-discharge-current high-energy third energy storage means for receiving the relatively-lower-power charging signal, and for storing the energy in such received charging signal;

a high power gating means for controllably gating the energy stored by the third energy storage means as an electrical pulse having a relatively higher power than any of the plurality of drive signals, and a relatively higher power than the arbitrary power level; and control means for controlling the low-power gating means to gate at least one drive signal to the third storage means as the charging signal, and for controlling the high power gating means to gate the energy stored by the third storage means as the electrical pulse only upon the lapse of such time as has permitted a predetermined amount of energy to be stored.

8. The improvement to a pulse driver according to claim 7 wherein the control means is controlling the low-power gating means to gate at least one drive signal to the third storage means as the charging signal only during such times as the high power gating means is not gating the energy stored by the second energy storage means as the electrical pulse.

9. An energy accumulator/pulse discharge circuit responsive to an external signal that is, at some times of its occurrence between its beginning and its cessation, exclusively unipolar and that is, at other times of its occurrence, bipolar, for producing, at separate times, high-power electric pulses at each of two polarities, the circuit comprising:

an energy accumulation means for receiving, at times, a charging signal at either of two polarities, and for accumulating over time the energy of this signal;

a first switch means controllable for gating each polarity of the external signal that is, at some times of its occurrence, exclusively unipolar and that is, at other times of its occurrence, bipolar, to the energy accumulation means as the charging signal from which energy may be accumulated;

a second switch means controllable for gating the energy accumulated by the energy accumulation means as an electrical pulse at a one, first, polarity in the event that the energy accumulation means received, via the first switch means, a charging signal at each of two polarities, and for gating the energy accumulated by the energy accumulation means as an electrical pulse at an opposite, second, polarity in the event that the energy accumulation means received, via the first switch means, a charging signal at only one polarity; and a control circuit means, responsive to the external signal, and responsive to the magnitude of energy accumulated over time by the accumulation means, for controlling the first switch to gate the external signal to the energy accumulation means only until a predetermined amount of energy is stored, and not thereafter, and for controlling the second switch means to gate the energy accumulated by the accumulation means as the electrical pulse only upon such times as the predetermined amount of energy has been stored;

wherein a bipolar external signal is converted to a unipolar electrical pulse of the first polarity; and wherein a unipolar external signal is converted to a unipolar electrical pulse of the opposite, second, polarity.

10. The circuit according to claim 9 wherein the energy accumulation means comprises:
a capacitor means for accumulating energy as electrical charge; and wherein the control circuit means comprises:
a voltage comparator means for comparing the voltage of the external signal to a voltage produced by the electrical charge upon the capacitor means; and wherein the second switch means comprises:
a power transistor responsive to the voltage comparator means for electrically isolating the electrical charge accumulated upon the capacitor means until a threshold level of electrical charge is accumulated at which time the accumulated electrical charge is discharged as the electrical pulse.

11. The circuit according to claim 10 wherein the first switch means comprises:
a transistor responsive to the voltage comparator means for gating the external signal to the capacitor means until said threshold level of charge is accumulated and thereafter, during such time as this accumulated charge is gated as the electrical pulse, electrically isolating the external signal from the capacitor means;
wherein the external signal is described as current limited in that it cannot be gated to the capacitor means during the discharge thereof.

12. A drive circuit for a solenoid coil, the drive circuit being responsive to a polarized external control signal bearing both (i) information and (ii) polarized external power from an external source of power for causing the solenoid coil to produce an electromagnetic field in each of two senses, the solenoid coil drive circuit comprising:
an electrical coil energizing means responsive to a first actuating electrical pulse at a first polarity to energize the solenoid coil to produce the electromagnetic field in a first one of it's two alternative senses, and responsive to a second actuating pulse of an opposite polarity to energize the solenoid coil to produce the electromagnetic field in the other, second, one of it's two alternative senses; and
a zero standby current pulse amplifier means responsive to the information within the external control signal for controllably selectively using the power that is also within the external signal for producing both the first and the second electrical actuating pulses to which the electrical coil energizing means is responsive for energizing the solenoid coil, the zero standby current pulse amplifier means
using power supplied by the source of power successively at each of two polarities in order to produce the first actuating electrical pulse, and, alternatively,
using power supplied by the source of power at only a one of the two polarities to produce the second actuating electrical pulse,
the pulse amplifier otherwise, and during such times as it is not enabled by information within the external control signal to produce the actuating electrical pulses by which the solenoid coil is energized, using substantially no power from the source of power;
wherein the solenoid coil is energized by the same external signal that, by the information that it bears, serves to energize the solenoid coil;
wherein the sense of the electromagnetic field produced in the solenoid coil is controllably selected by the same external signal that, by the power that it bears, serves to energize the solenoid coil;
wherein during such periods of time as the solenoid coil is not selected by information within the external control signal, it uses substantially no power.

* * * * *